United States Patent [19]

Tanaka

[11] Patent Number: 4,641,055
[45] Date of Patent: Feb. 3, 1987

[54] PIEZOELECTRIC RESONATOR WITH NOTCHED SIDES

[75] Inventor: Yasuhiro Tanaka, Ishikawa, Japan

[73] Assignee: Murata Manufacturing Co., Ltd., Nagaokakyo, Japan

[21] Appl. No.: 842,840

[22] Filed: Mar. 24, 1986

[30] Foreign Application Priority Data

Apr. 1, 1985 [JP] Japan .................................. 60-69551

[51] Int. Cl.⁴ .......................................... H01L 41/08
[52] U.S. Cl. ..................................... 310/368; 310/312
[58] Field of Search ................ 310/320, 321, 348–353, 310/367, 368, 312

[56] References Cited

U.S. PATENT DOCUMENTS 2,870,521  1/1959  Rudnick ......................... 310/312 X
3,074,034  1/1963  Crownover ..................... 310/312 X

FOREIGN PATENT DOCUMENTS 0027733  2/1980  Japan .................................. 310/312

Primary Examiner—Mark O. Budd
Attorney, Agent, or Firm—Wenderoth, Lind & Ponack

[57] ABSTRACT

A piezoelectric resonator including a piezoelectric substrate of a quadrilateral or rectangular configuration, and electrode layers provided over opposite main faces of the piezoelectric substrate for vibration of the piezoelectric substrate on the whole, and characterized in that the piezoelectric substrate is formed, in its four side edges, with notched portions having dimensions and shapes different from each other.

3 Claims, 6 Drawing Figures

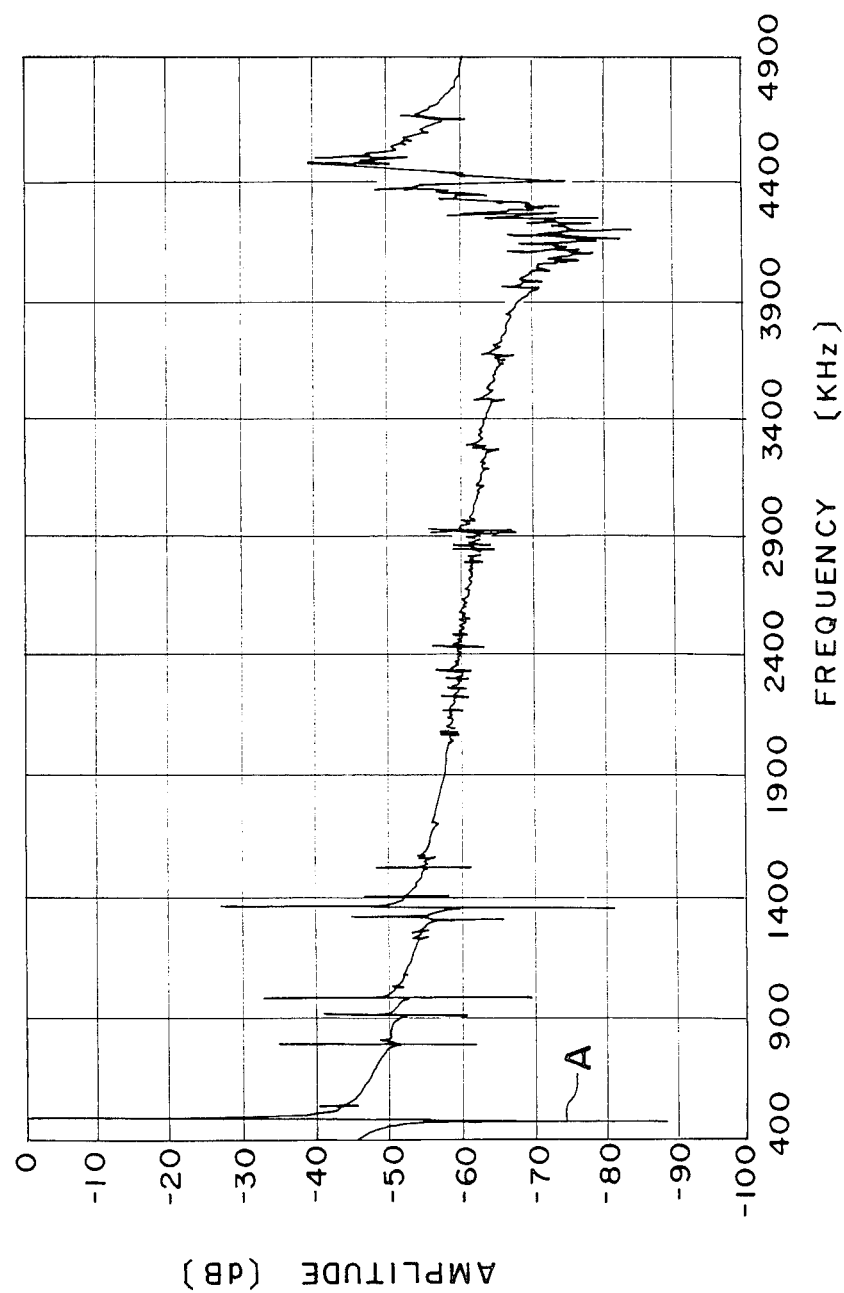

PIEZOELECTRIC RESONATOR WITH NOTCHED SIDES

BACKGROUND OF THE INVENTION

The present invention generally relates to an electrical resonator and more particularly, to a piezoelectric resonator with an improved spurious characteristic.

Conventionally, as shown in FIGS. 1 and 2, there has been available a piezoelectric ceramic resonator 4 which includes a piezoelectric substrate 1 of a quadrilateral or rectangular configuration such as a square shape, and electrode layers 2 and 3 provided over opposite main faces of said piezoelectric substrate 1 so as to employ a vibrating mode, for example, an expansion vibrating mode by which the entire substrate is to be vibrated. Since such a resonator utilizes mechanical vibrations, unnecessary spurious vibration is also present besides the main vibration, and although various suppressing methods for suppressing such spurious vibration have been proposed, application of one method is not perfect, but it is also necessary to combine several auxiliary methods therewith for the purpose. One practice for the purpose is such that as shown in FIG. 2, notched portions such as slits 5, 6, 7 and 8 generally of the same dimensions are formed each at the central portion of the respective side edges.

FIG. 5 shows one example of a spurious characteristic diagram as obtained from the known piezoelectric resonator as described above and formed with slits 5, 6, 7 and 8, each having a width of 0.5 mm and a depth of 0.3 mm and provided at the central portion of each side edge of the resonator with dimensions of 4.3 mm in one side edge, 4.3 mm in another side edge and 0.5 mm in depth (i.e., dimensions represented as in 4.3 mm×4.3 mm×0.5 mm hereinafter).

SUMMARY OF THE INVENTION

Accordingly, an essential object of the present invention is to provide a piezoelectric resonator in which the spurious characteristic thereof has been further improved for substantial elimination of disadvantages inherent in the conventional piezoelectric resonator of this kind.

Another important object of the present invention is to provide a piezoelectric resonator of the above described type, which is simple in construction and stable in functioning, and can be readily manufactured on a large scale at low cost.

According to the present invention, it is intended to achieve such objects by differentiating dimensions and configurations of the notched portions formed in the side edges of the piezoelectric resonator.

More specifically, in accomplishing these and other objects, according to one preferred embodiment of the present invention, there is provided a piezoelectric resonator including a piezoelectric substrate of a quadrilateral or rectangular configuration, and electrode layers provided over opposite main faces of the piezoelectric substrate for vibration of said piezoelectric substrate on the whole, and characterized in that the piezoelectric substrate is formed, in four side edges thereof, with notched portions having dimensions and shapes different from each other.

By differentiating the dimensions and configurations of the notch portions as described above, degree of influence with respect to the vibration mode largely depending on the shapes and dimensions of side edges becomes different, and consequently, strong excitation only of a particular mode may be eliminated. On the other hand, the expansion vibration mode in the lowest order which serves as the main vibration is not so much affected by the shapes and dimensions of the side edges as compared with the spurious vibration mode having higher frequencies than the above. Accordingly, by the construction of the present invention, the spurious characteristic has been improved more effectively than in the conventional arrangements.

BRIEF DESCRIPTION OF THE DRAWINGS

These and other objects and features of the present invention will become apparent from the following description taken in conjunction with the preferred embodiment thereof with reference to the accompanying drawings, in which:

FIG. 6 is a similar spurious characteristic diagram as obtained from the piezoelectric resonator according to the present invention.

DETAILED DESCRIPTION OF THE INVENTION

Figure 1:
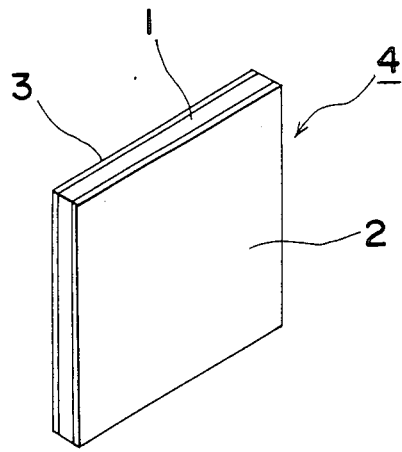
FIGS. 1 and 2 are a perspective view and a top plan view of a conventional piezoelectric resonator (already referred to)

Before the description of the present invention proceeds, it is to be noted that like parts are designated by like reference numerals throughout the accompanying drawings.

Figure 2:
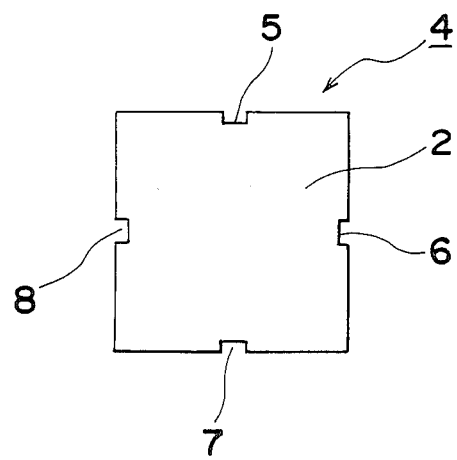
Figure 3:
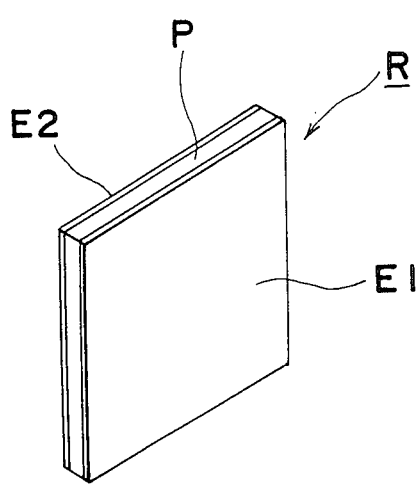
FIGS. 3 and 4 are views similar to FIGS. 1 and 2, which particularly show a piezoelectric resonator according to one preferred embodiment of the present invention.
Figure 4:
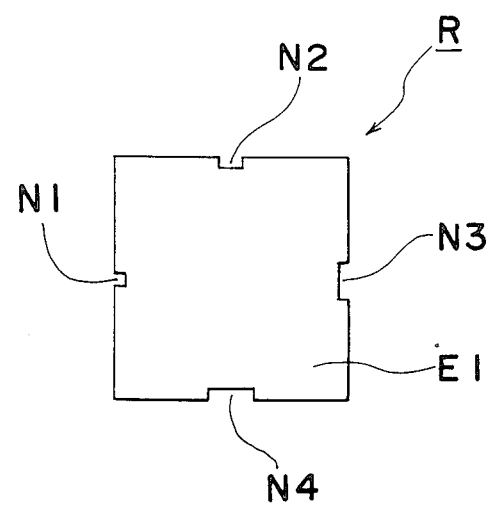
Figure 5:
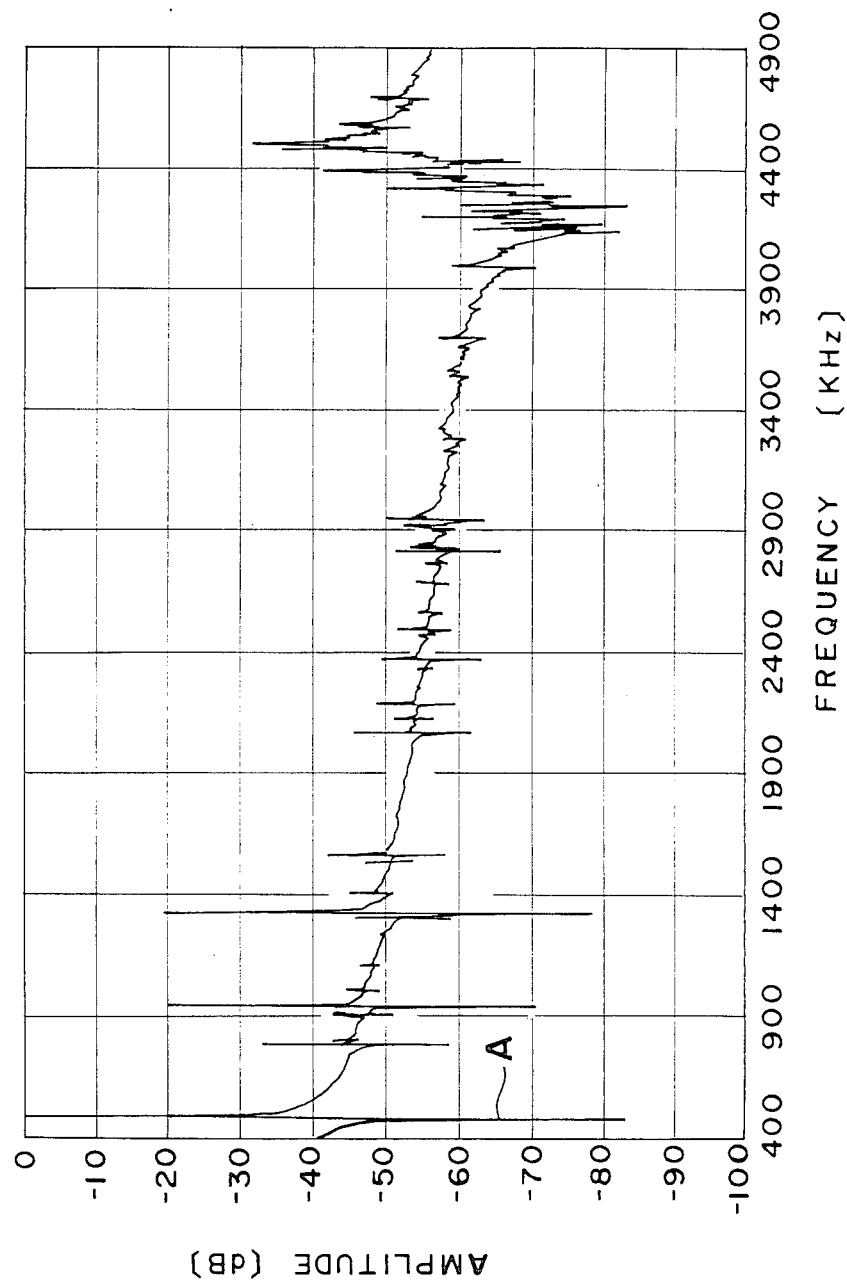
FIG. 5 is a spurious characteristic diagram as obtained from the conventional piezoelectric resonator.

Referring now to the drawings, there is shown in FIGS. 3 and 4, an improved piezoelectric resonator R according to one preferred embodiment of the present invention, which includes a piezoelectric substrate P of a quadrilateral or rectangular configuration, applied on its opposite main faces, with electrode layers E1 and E2 and having external dimensions, for example, 4.3 mm×4.3 mm×0.5 mm similar to those of the conventional resonator 4 in FIGS. 1 and 2. The piezoelectric resonator R according to the present invention referred to above in FIGS. 3 and 4 is particularly characterized in that, in four side edges thereof, there are formed notched portions or slits N1, N2, N3 and N4 having the same depth of 0.3 mm, but different widths of 0.3 mm, 0.5 mm, 0.7 mm and 1.0 mm respectively as illustrated. In FIG. 6, there is shown a spurious characteristic diagram as obtained from the above piezoelectric resonator R. As compared with the spurious characteristic diagram for the conventional piezoelectric resonator 4 in FIG. 5, it will be seen that, in the piezoelectric resonator R of the present invention, the spurious response has been improved as a whole by 3 to 8 (dB) and 5 (dB) on the average, without deteriorating the main response A.

It should be noted here that the widths, shapes (e.g., formation of cross sections into U-shape, V-shape, etc.), depths, number and forming positions of the notched portions may be modified depending on the characteristics required from the viewpoints of frequencies to be adopted or on the design requirements as a product.

Similarly, the configuration of the resonator is not limited to the square shape as described in the foregoing embodiment, but may be modified into any known configurations within the scope.

Although the present invention has been fully described by way of example with reference to the accompanying drawings, it is to be noted here that verious changes and modifications will be apparent to those skilled in the art. Therefore, unless otherwise such changes and modifications depart from the scope of the present invention, they should be construed as being included therein.

What is claimed is:

1. A piezoelectric resonator which comprises a piezoelectric substrate of a quadrilateral configuration, and electrode layers provided over opposite main faces of said piezoelectric substrate, said piezoelectric substrate being formed, in four side edges thereof, with notched portions, said notched portions having dimensions and shapes different from each other.

2. A piezoelectric resonator as claimed in claim 1, wherein said piezoelectric substrate is of a piezoelectric ceramic material, said piezoelectric resonator employing an expansion vibration mode.

3. A piezoelectric resonator as claimed in claim 1, having external dimensions of 4.3 mm in one side, 4.3 mm in another side and 0.5 mm in depth, said notched portions having the same depth of 0.3 mm, but different widths of 0.3 mm, 0.5 mm, 0.7 mm and 1.0 mm, respectively.

* * * * *